US010431482B2

(12) United States Patent
Goto

(10) Patent No.: US 10,431,482 B2
(45) Date of Patent: Oct. 1, 2019

(54) SUBSTRATE CONVEYANCE ROBOT AND SUBSTRATE DETECTION METHOD

(71) Applicant: KAWASAKI JUKOGYO KABUSHIKI KAISHA, Kobe-shi, Hyogo (JP)

(72) Inventor: Hirohiko Goto, Akashi (JP)

(73) Assignee: KAWASAKI JUKOGYO KABUSHIKI KAISHA, Kobe-shi (JP)

( * ) Notice: Subject to any disclaimer, the term of this patent is extended or adjusted under 35 U.S.C. 154(b) by 0 days.

(21) Appl. No.: 15/570,226

(22) PCT Filed: Apr. 21, 2016

(86) PCT No.: PCT/JP2016/062687
§ 371 (c)(1),
(2) Date: Oct. 27, 2017

(87) PCT Pub. No.: WO2016/175133
PCT Pub. Date: Nov. 3, 2016

(65) Prior Publication Data
US 2018/0130693 A1    May 10, 2018

(30) Foreign Application Priority Data
Apr. 27, 2015 (JP) .................. 2015-090814

(51) Int. Cl.
*H01L 21/68* (2006.01)
*H01L 21/67* (2006.01)
(Continued)

(52) U.S. Cl.
CPC ........ *H01L 21/67259* (2013.01); *B25J 9/042* (2013.01); *B25J 9/06* (2013.01);
(Continued)

(58) Field of Classification Search
CPC ........................ H01L 21/67259; H01L 21/68
See application file for complete search history.

(56) References Cited

U.S. PATENT DOCUMENTS

| 2008/0232937 A1* | 9/2008 | Abe ................. H01L 21/67265 414/222.02 |
| 2010/0111650 A1* | 5/2010 | Quach ..................... C23C 16/54 414/221 |

(Continued)

FOREIGN PATENT DOCUMENTS

| JP | 09283600 A * 10/1997 ............. H01L 21/68 |
| JP | H09-283600 A 10/1997 |

(Continued)

OTHER PUBLICATIONS

Jul. 26, 2016 Search Report issued in International Patent Application No. PCT/JP2016/062687.

(Continued)

*Primary Examiner* — Thomas Randazzo
(74) *Attorney, Agent, or Firm* — Oliff PLC

(57) ABSTRACT

A substrate conveyance robot is provided with a robot arm capable of elevating; a substrate holding device mounted to the robot arm; and a substrate detection unit for detecting a substrate held by the substrate holding device. The substrate detection unit has a substrate sensor for detecting the substrate and a sensor elevating unit for scanning a region including a position where the substrate is arranged by elevating the substrate sensor without elevating the robot arm. Thus, the substrate in a device provided with an opening having a small dimension can be detected without hindrance while preventing collision of the robot and the device.

8 Claims, 12 Drawing Sheets

(51) Int. Cl.
    *B25J 9/06*           (2006.01)
    *H01L 21/677*      (2006.01)
    *B25J 9/04*           (2006.01)
    *B25J 9/16*           (2006.01)
    *B25J 11/00*         (2006.01)
    *B25J 15/00*         (2006.01)
    *H01L 21/683*      (2006.01)
    *H01L 21/687*      (2006.01)

(52) U.S. Cl.
CPC ......... *B25J 9/1697* (2013.01); *B25J 11/0095* (2013.01); *B25J 15/0014* (2013.01); *H01L 21/677* (2013.01); *H01L 21/67742* (2013.01); *H01L 21/67766* (2013.01); *H01L 21/67778* (2013.01); *H01L 21/6838* (2013.01); *H01L 21/68707* (2013.01)

(56) References Cited

U.S. PATENT DOCUMENTS

2017/0062264 A1*   3/2017   Tang ................. H01L 21/68707
2018/0029237 A1*   2/2018   Sugawara ................ B25J 13/08

FOREIGN PATENT DOCUMENTS

| JP | 2000-36528 A | 2/2000 |
| JP | 2000-124289 A | 4/2000 |
| JP | 2008-147583 A | 6/2008 |

OTHER PUBLICATIONS

Jul. 26, 2016 Written Opinion issued in International Patent Application No. PCT/JP2016/062687.

\* cited by examiner

SUBSTRATE CONVEYANCE ROBOT AND SUBSTRATE DETECTION METHOD

TECHNICAL FIELD

The present invention relates to a substrate conveyance robot having a robot arm to which a substrate holding device is mounted and to a substrate detection method for detecting a substrate conveyed by the substrate conveyance robot.

BACKGROUND ART

Conventionally, a technology of conveying substrates such as wafers for manufacturing semiconductors by a robot is used broadly. Here, various processing steps such as a wafer cleaning process, a film-forming process, a heating process, and an etching process are executed when manufacturing semiconductors. The respective processing steps are executed by different processing devices respectively, and therefore wafers need to be conveyed between a plurality of processing devices.

A substrate conveyance robot used for conveying substrates such as wafer is configured for example by attaching a base end portion of a robot arm to a top end portion of a rotary spindle which can be elevated along a Z-axis, and mounting a hand as a substrate holding device to a distal end portion of the robot arm. The hand has a blade member on which a substrate is to be placed and held.

Then, when a substrate is taken out from the inside of a substrate storing container in which multiple substrates are stored, the rotary spindle and the robot arm are driven by a robot controller so as to advance the blade member of the hand between substrates stored in the container and position the blade member below a substrate to be conveyed. From this state, the rotary spindle is elevated and the substrate to be conveyed is placed on the blade member, and the substrate is fixed on the blade member by a substrate fix mechanism (such as edge grip mechanism and vacuum sucking mechanism) provided to the hand.

Subsequently, the robot arm and the rotary spindle are driven by the robot controller so as to draw the blade member together with the substrate from the container and the substrate is conveyed to a predetermined conveyance destination.

When a substrate is to be carried out from the container using the substrate conveyance robot as mentioned above, there are cases when work (mapping) for confirming the storing state of multiple substrates stored in the container (such as presence/absence of substrates) using a substrate detection sensor is performed.

This mapping work may be performed using a mapping mechanism installed separately from the substrate conveyance robot (Patent Document 1) or may be performed using a substrate detection sensor mounted to the substrate conveyance robot (Patent Document 2).

In the latter case, for example, an optical sensor is mounted to a distal end portion of the blade member of the robot hand and presence/absence of a substrate is determined based on a detection signal of the optical sensor. Thus, the rotary spindle to which the base end portion of the robot arm is mounted is elevated or lowered so as to make the distal end portion of the blade member of the robot hand scan along edge portions of multiple substrates arranged in the vertical direction.

Then, an output signal of the optical sensor is changed between the case when a substrate is present and the case when a substrate is not present in each slot of the substrate storing container. Thus presence/absence of a substrate in each slot is detected based on this output signal.

Additionally, also when presence/absence of a substrate in a processing device for processing a substrate, not in the substrate storing container, is detected, the rotary spindle and the robot arm are driven so as to insert the robot hand into the processing device, and the rotary spindle is elevated or lowered so as to make the distal end portion of the blade member scan along an edge portion of a substrate.

Also in this case, the output signal of the optical sensor is changed between the case when a substrate is present and the case when a substrate is not present in the processing device. Thus presence/absence of a substrate in the processing device can be detected based on this output signal.

RELATED ART DOCUMENTS

Patent Documents

[Patent Document 1] Japanese Patent Application Laid-Open No. 2008-147583
[Patent Document 2] Japanese Patent Application Laid-Open No. 2000-124289

SUMMARY OF INVENTION

Object to be Achieved by the Invention

However, there are cases when the dimension of an opening on the processing device side into which the robot hand is inserted is small. Then, if the rotary spindle is elevated so as to perform a substrate detection operation after inserting the robot hand into the processing device via such a small opening, the robot may collide with the processing device.

Therefore, when the dimension of the opening of the processing device is small, the substrate detection may not be performed by the same operation as the mapping operation, namely an operation accompanied by elevation of the robot arm.

The present invention is made considering the above-mentioned problems of the conventional technology and its object is to provide a substrate conveyance robot and a substrate detection method capable of detecting a substrate in a device provided with an opening having a small dimension without hindrance while preventing collision of the robot and the device.

Means for Achieving the Object

In order to achieve the above-mentioned object, a first aspect of the present invention is a substrate conveyance robot for holding and conveying a substrate, comprising: a robot arm capable of being elevated; a substrate holding device mounted to the robot arm; and a substrate detection unit for detecting the substrate held by the substrate holding device, wherein the substrate detection unit has a substrate sensor for detecting the substrate, and a sensor elevating unit for scanning a region including a position where the substrate is arranged by elevating the substrate sensor without elevating the robot arm.

A second aspect of the present invention is that, in the first aspect, the substrate sensor is provided to the substrate holding device.

A third aspect of the present invention is that, in the second aspect, the substrate holding device has a wrist portion mounted to the robot arm, and a blade member which is provided to the wrist portion and on which the substrate is to be placed, wherein the substrate sensor is provided to the blade member, and wherein the sensor elevating unit is configured to elevate the blade member relative to the wrist portion.

A fourth aspect of the present invention is that, in the second aspect, the substrate holding device has a wrist portion mounted to the robot arm, and an upper blade member and a lower blade member which are provided to the wrist portion and on which the substrate is to be placed respectively, wherein the substrate sensor is provided to at least one blade member of the upper blade member and the lower blade member, and wherein the sensor elevating unit is configured to elevate the at least one blade member relative to the wrist portion.

A fifth aspect of the present invention is that, in the second aspect, the substrate holding device has an upper substrate holding device and a lower substrate holding device which can be driven independently from each other, wherein the substrate detection unit is provided to at least one of the upper substrate holding device and the lower substrate holding device.

A sixth aspect of the present invention is a substrate detection method for detecting a substrate held by a substrate conveyance robot, comprising: a preparation step of driving a robot arm of the substrate conveyance robot so as to bring a substrate holding device mounted to the robot arm close to a position where the substrate is arranged; and a detection step of detecting the substrate by elevating a substrate sensor provided to the substrate holding device without elevating the robot arm so as to scan a region including a position where the substrate is arranged.

A seventh aspect of the present invention is that, in the sixth aspect, the substrate holding device has a wrist portion mounted to the robot arm, and a blade member which is provided to the wrist portion and on which the substrate is to be placed, wherein the substrate sensor is provided to the blade member, and wherein the blade member is elevated relative to the wrist portion in the detection step.

An eighth aspect of the present invention is that, in the sixth aspect, the substrate holding device has a wrist portion mounted to the robot arm, and an upper blade member and a lower blade member which are provided to the wrist portion and on which the substrate is to be placed respectively, wherein the substrate sensor is provided to at least one blade member of the upper blade member and the lower blade member, and wherein the at least one blade member is elevated relative to the wrist portion in the detection step.

A ninth aspect of the present invention is that, in the sixth aspect, the substrate holding device has an upper substrate holding device and a lower substrate holding device which can be driven independently from each other, wherein the substrate detection unit is provided to at least one substrate holding device of the upper substrate holding device and the lower substrate holding device, and wherein the substrate sensor provided to the at least one substrate holding device is elevated in the detection step.

Advantageous Effect of the Invention

The present invention can provide a substrate conveyance robot and a substrate detection method capable of detecting a substrate in a device provided with an opening having a small dimension without hindrance while preventing collision of the robot and the device.

EMBODIMENT OF THE INVENTION

Hereunder, a substrate conveyance robot according to one embodiment of the present invention will be described referring to the figures. Note that the substrate conveyance robot according to this embodiment is particularly suitable for conveying wafers (circular substrate) for manufacturing semiconductors.

Figure 1:
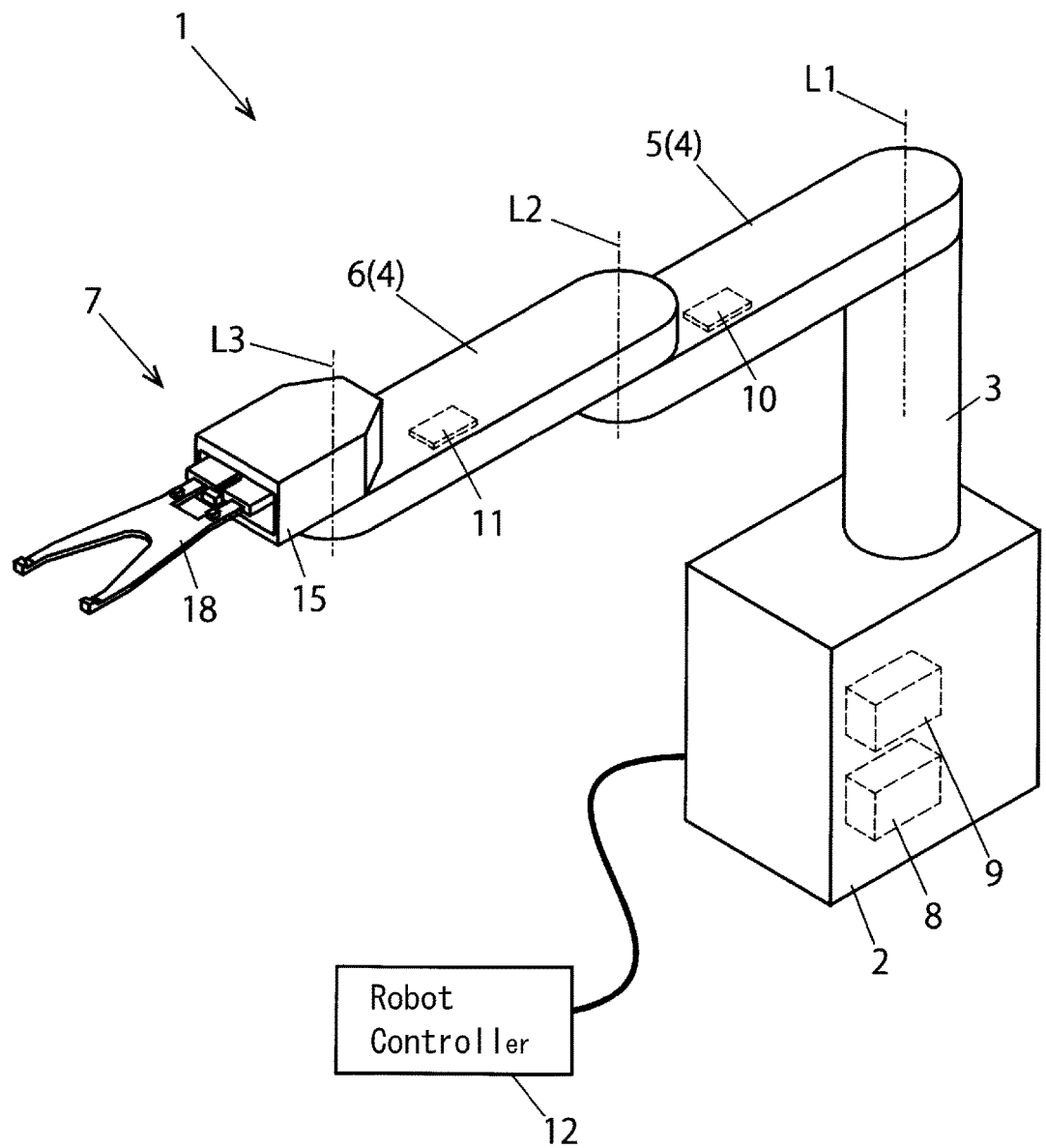
FIG. 1 is a perspective view schematically illustrating a substrate conveyance robot according to one embodiment of the present invention.

As illustrated in FIG. 1, a substrate conveyance robot 1 according to this embodiment has a base 2. A rotary spindle 3 is provided to the base 2 so as to be elevated along a first rotational axis L1.

A base end of a robot arm 4 is connected to an upper end of the rotary spindle 3. The robot arm 4 has a first link member 5 having the first rotational axis L1 at the base end thereof and also having a second rotational axis L2 at a distal end thereof, and a second link member 6 having the second rotational axis L2 at a base end thereof and also having a third rotational axis L3 on a distal end thereof. A hand (substrate holding device) 7 is provided to the distal end of the second link member 6 so as to be rotated about the third rotational axis L3.

An elevating operation and a rotating operation of the rotary spindle 3 are performed by a Z-axis elevating drive source 8 and a turning drive source 9 provided inside the base 2, respectively. The rotary spindle 3 rotates about the first rotational axis L1 so that the first link member 5 rotates about the first rotational axis L1 integrally with the rotary spindle 3.

The rotating operation of the second link member 6 relative to the first link member 5 is performed by a drive source 10 provided inside the first link member 5. The rotating operation of the hand 7 relative to the second link member 6 is performed by a drive source 11 provided inside the second link member 6.

The hand 7 can be elevated by elevating the robot arm 4 by the Z-axis elevating drive source 8. The drive sources 8, 9, 10, 11 can be configured by servo motors, for example. Each drive source 8, 9, 10, 11 is controlled by a robot controller 12. Thereby, the elevating operation and the rotating operation of the robot arm 4 having the hand 7 are controlled.

Note that the configuration of the robot arm of the substrate conveyance robot according to the present invention and its drive unit is not limited to the above-mentioned configuration illustrated in FIG. 1, and any configuration capable of positioning the substrate holding device to a substrate to be conveyed can be employed.

Figure 2:
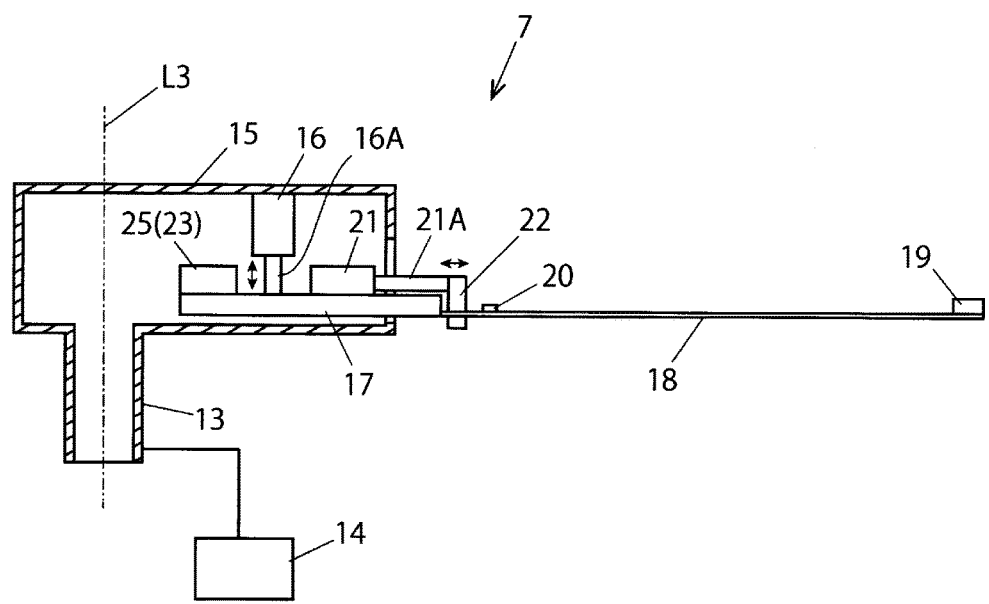
FIG. 2 is a schematic sectional view of an internal structure of a hand of the substrate conveyance robot in FIG. 1.

As illustrated in FIG. 2, the hand 7 mounted to the distal end of the robot arm 4 has a wrist shaft 13 extending along the third rotational axis L3 and a wrist shaft drive source 14 for rotationally driving this wrist shaft 13 about the third rotational axis L3. The wrist shaft drive source 14 can be configured by a servo motor.

The hand 7 has a hand base portion (wrist portion) 15 consisting of a hollow member connected to an upper end of the wrist shaft 13. An elevating air cylinder 16 is provided inside the hand base portion 15 with its piston 16A facing downward. The elevating air cylinder 16 can be driven by the robot controller 12. Note that, although the piston 16A of the elevating air cylinder 16 faces downward in this embodiment, it may be arranged facing upward.

An elevating member 17 is connected to a distal end of the piston 16A of the elevating air cylinder 16. A base end portion of a blade member 18 for holding a substrate is connected to the elevating member 17. The elevating air cylinder 16 and the elevating member 17 configure a blade elevating unit.

Figure 3:
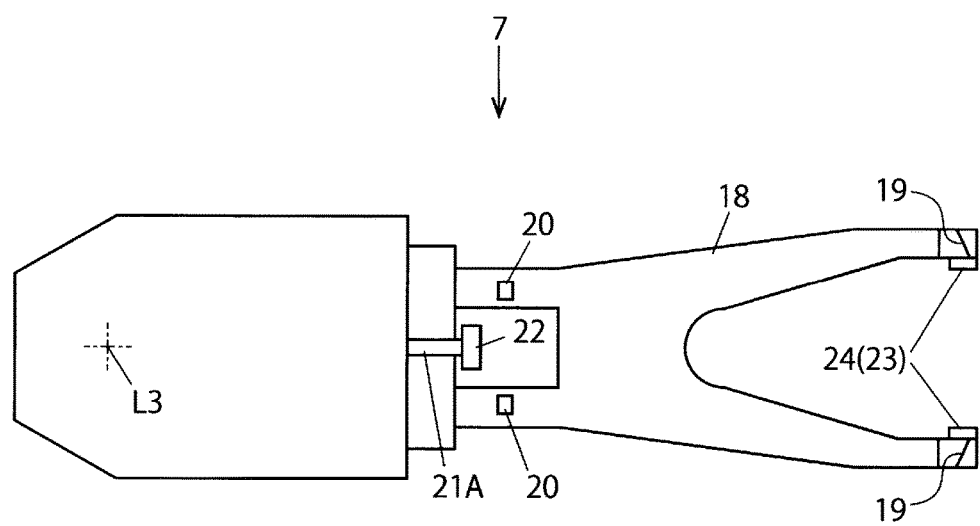
FIG. 3 is a plan view schematically illustrating the hand of the substrate conveyance robot in FIG. 1.

As illustrated in FIG. 2 and FIG. 3, a pair of fixed clamping portions 19 abutted on edge portions of a substrate are provided on an upper surface of a distal end portion of the blade member 18. A pair of bottom surface supporting portions 20 for supporting a bottom surface of the substrate are provided on an upper surface of the base end portion of the blade member 18.

As illustrated in FIG. 2, a pressing air cylinder 21 is provided on an upper surface of the elevating member 17 with its piston 21A facing forward. A movable clamping portion 22 for pressing the substrate so as to clamp the substrate together with the fixed clamping portion 19 is provided to a distal end of the piston 21A of the pressing air cylinder 21. The pressing air cylinder 21 can be driven by the robot controller 12.

The pressing air cylinder 21 is provided to the elevating member 17 and also the blade member 18 is provided to the elevating member 17. Therefore, the movable clamping portion 22 is elevated integrally with the pressing air cylinder 21 interlockingly with the elevating operation of the blade member 18.

Figure 4:
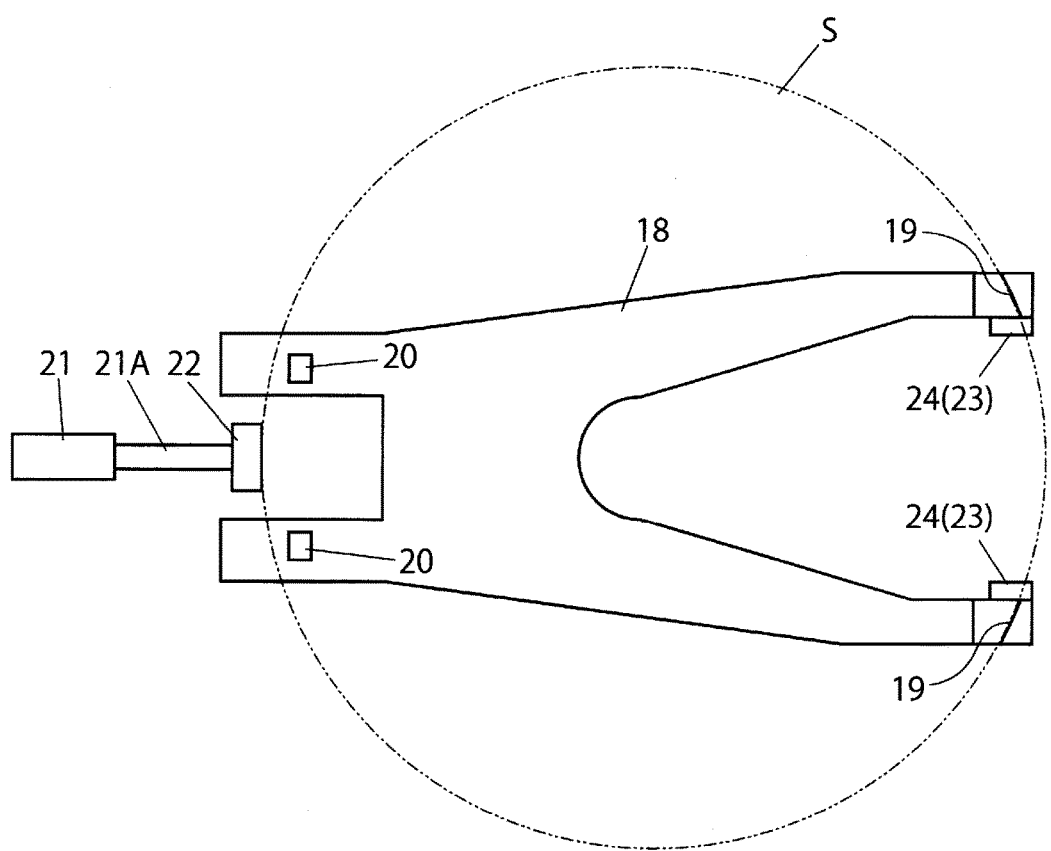
FIG. 4 is a schematic plan view illustrating a state that a substrate is held on a blade member of the hand of the substrate conveyance robot in FIG. 1.

As illustrated in FIG. 4, by driving the pressing air cylinder 21 so as to advance the piston 21A, the substrate S is clamped by the movable clamping portion 22 and the fixed clamping portion 19 and thus the substrate S is held on the blade member 18.

As illustrated in FIG. 2 and FIG. 3, a substrate detection unit 23 for detecting the substrate held by the hand 7 is provided to the hand 7 of the substrate conveyance robot 1. The substrate detection unit 23 has a substrate sensor 24 provided to the distal end portion of the blade member 18 and a sensor amplifier 25 connected to this substrate sensor 24. The sensor amplifier 25 is provided on the upper surface of the elevating member 17. The substrate sensor 24 is a sensor for detecting the substrate S in a non-contact manner and it can be configured by a transmission type optical sensor or a reflection type optical sensor, for example.

As mentioned above, the substrate sensor 24 is provided to the blade member 18 and the blade member 18 is provided to the elevating member 17. Therefore, by driving the elevating air cylinder 16 so as to elevate the elevating member 17, the substrate sensor 24 can be elevated integrally with the blade member 18 relative to the hand base portion (wrist portion) 15. Thus, the substrate sensor 24 can be elevated without elevating the whole hand 7 together with the robot arm 4 by elevating the rotary spindle 3.

The elevating air cylinder 16 and the elevating member 17 configure a sensor elevating unit in the present invention, and the sensor elevating unit configures part of the substrate detection unit. The sensor elevating unit elevates the substrate sensor 24 without elevating the robot arm 4 so as to scan a region including a position where a substrate to be held is arranged by the substrate sensor 24.

Next, a substrate detection method for detecting the substrate S to be held using the above-mentioned substrate conveyance robot 1 will be described referring to FIG. 5A and FIG. 5B.

First, in a state that the hand 7 does not hold the substrate S, the rotary spindle 3 and the robot arm 4 are driven by the robot controller 12 so as to insert the hand 7 inside a processing device 50 via an opening 51 of the processing device 50 and bring the hand 7 close to the position where the substrate S is arranged (preparation step). At this time, the piston 16A of the elevating air cylinder 16 is in a retracted position and the blade member 18 of the hand 7 is in an upper position.

Figure 5A:
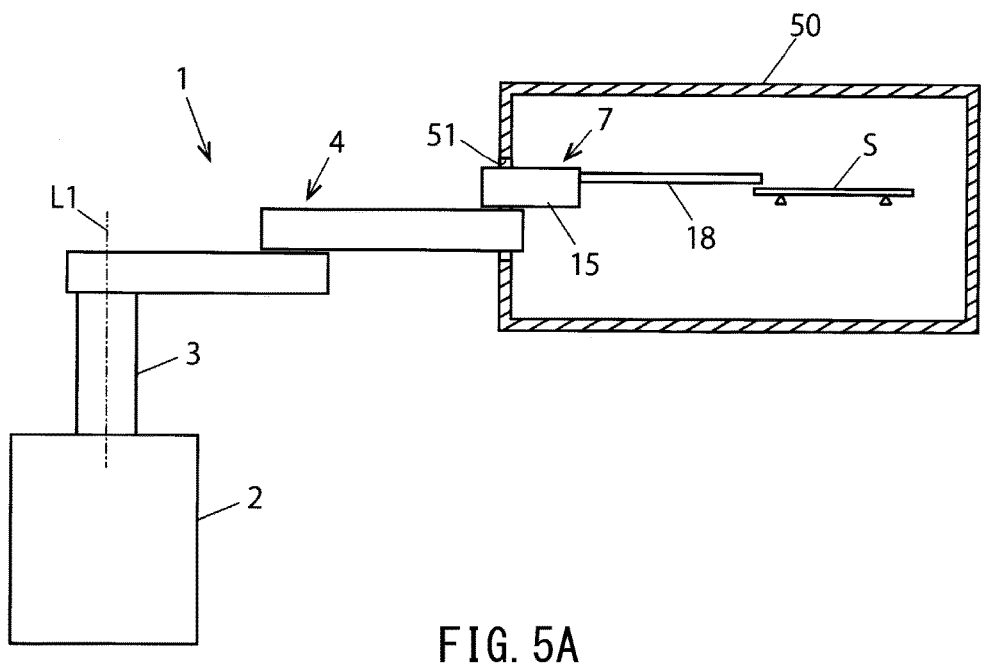
FIG. 5A is a view illustrating a substrate detection operation for detecting a substrate in a processing device by the substrate conveyance robot in FIG. 1.

By the above-mentioned preparation step, the distal end portion of the blade member 18 of the hand 7 is arranged to a position slightly higher than the substrate S in the vicinity of a front edge portion of the substrate S, as illustrated in FIG. 5A.

From the state illustrated in FIG. 5A, the elevating air cylinder 16 is driven so as to advance the piston 16A, thereby lowering the blade member 18 from the upper position to a lower position (detection step). At this time, the robot arm 4 does not perform the elevating operation, and therefore the height of the robot arm 4 and the hand 7 is not changed.

Figure 5B:
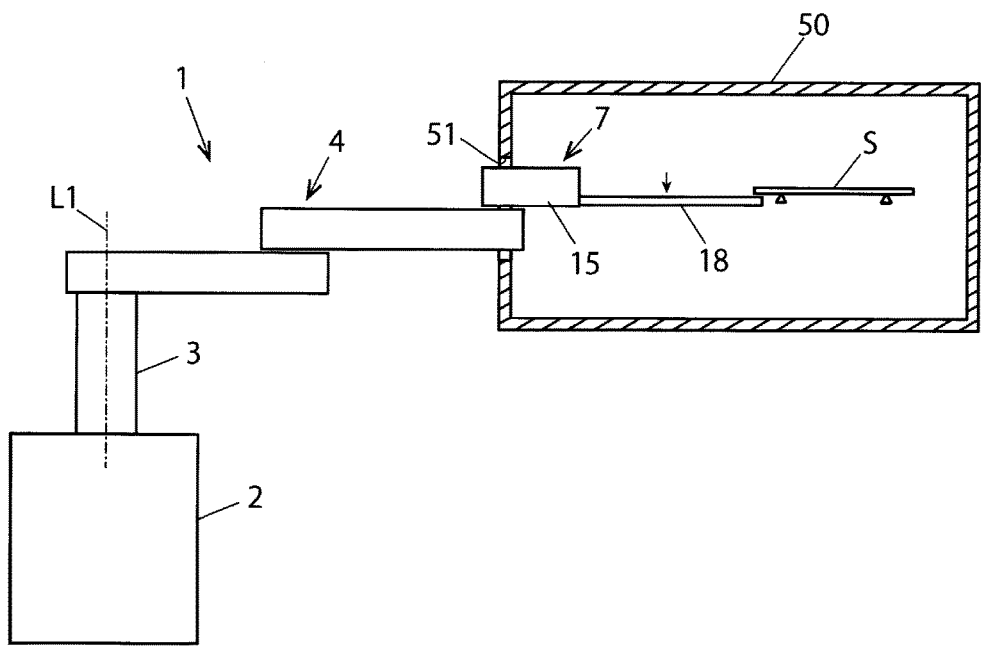
FIG. 5B is another view illustrating the substrate detection operation for detecting a substrate in a processing device by the substrate conveyance robot in FIG. 1.

By the above-mentioned detection step, the distal end portion of the blade member 18 of the hand 7 is arranged to a position slightly lower than the substrate S in the vicinity of the front edge portion of the substrate S, as illustrated in FIG. 5B. Thus, in the detection step, the substrate sensor 24 provided to the distal end portion of the blade member 18 of the hand 7 is lowered without lowering the robot arm 4 so as to scan a region including a position where the substrate S is arranged by the substrate sensor 24.

Additionally, the output signal of the substrate sensor 24 is changed between the case when the substrate S is present and the case when the substrate S is not present. Thus presence/absence of the substrate S can be detected based on this output signal in the non-contact manner.

As stated above, by the substrate conveyance robot 1 according to this embodiment and the substrate detection method using the robot 1, the substrate S in the processing device 50 can be detected without elevating the robot arm 4. Therefore, even when the dimension of the opening 51 of the processing device 50 into which the hand 7 of the robot arm 4 is inserted is small, the robot arm 4 and the hand 7 never collide with the processing device 50 upon the substrate detection operation.

Next, a variation of the above-mentioned substrate conveyance robot 1 will be described referring to FIG. 6 to FIG. 7B.

Figure 6:
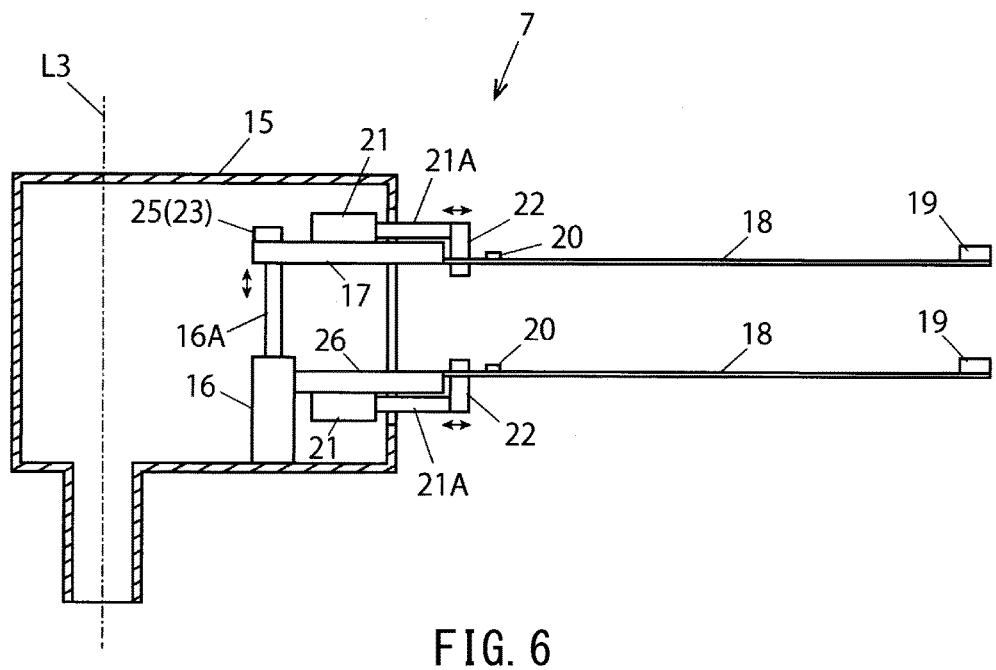
FIG. 6 is a schematic sectional view illustrating an internal structure of a hand of a variation of the substrate conveyance robot in FIG. 1.

As illustrated in FIG. 6, in this example, the elevating air cylinder 16 is arranged in the hand base portion (wrist portion) 15 with its piston 16A facing upward. The elevating member 17 is attached to the upper end of the piston 16A of the elevating air cylinder 16 like the above-mentioned embodiment, and the above-mentioned blade member 18, the substrate detection unit 23, and the like are attached to the elevating member 17 similarly.

Additionally, in this example, the additional blade member (lower blade member) 18 is provided below the elevatable blade member (upper blade member) 18 having the substrate detection unit 23 so as to be fixed to the hand base portion 15. The additional blade member (lower blade member) 18 is attached to a main body of the elevating air cylinder 16 via a fixing member 26.

In the hand 7 according to this example, tact time for substrate conveyance can be shortened by conveying two substrates S at the same time by the upper and lower blade members 18. Additionally, cross contamination can be prevented by using one blade member 18 for conveying the clean substrate S and using the other blade member 18 for conveying the contaminated substrate S.

Figure 7A:
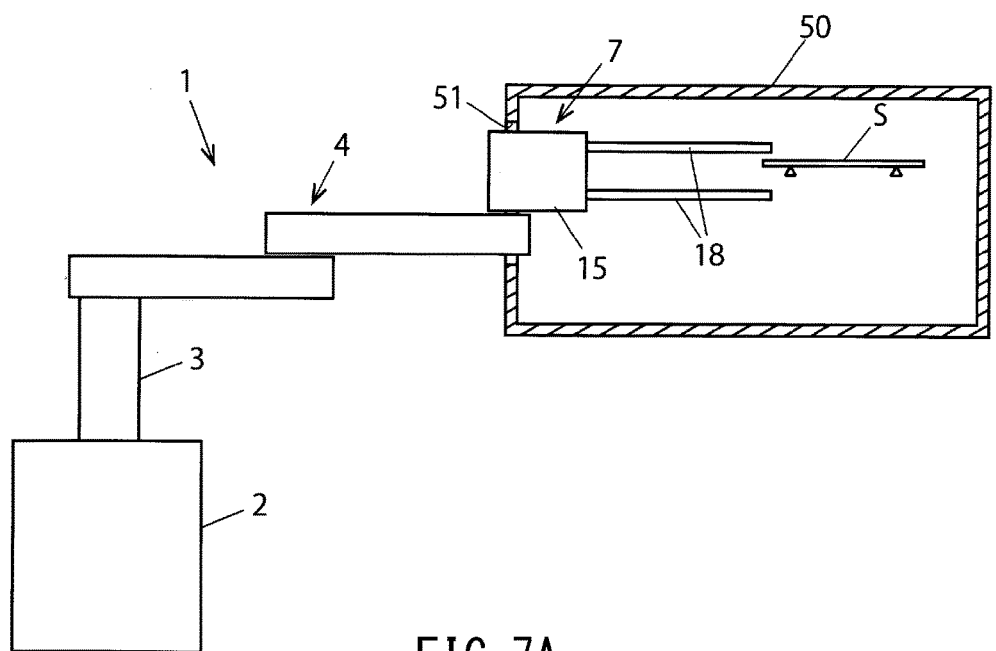
FIG. 7A is a view illustrating a substrate detection operation for detecting a substrate in a processing device by a substrate conveyance robot provided with the hand in FIG. 6.
Figure 7B:
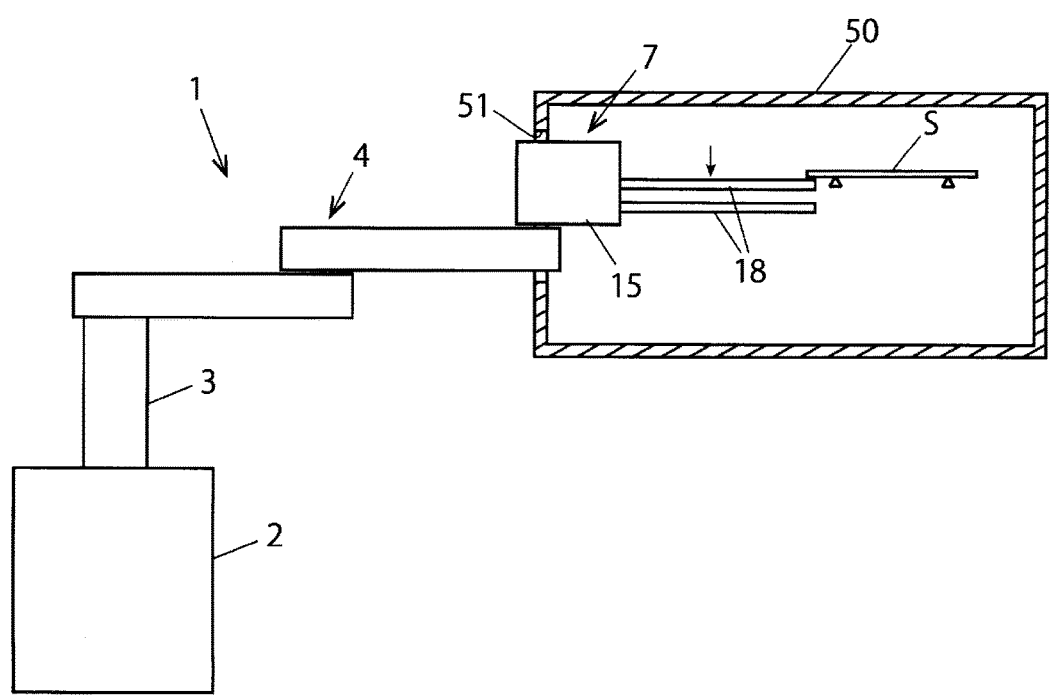
FIG. 7B is another view illustrating the substrate detection operation for detecting a substrate in the processing device by the substrate conveyance robot provided with the hand in FIG. 6.

Also in this example, the substrate S in the processing device 50 can be detected without hindrance while preventing collision of the robot 1 and the processing device 50 like the above-mentioned embodiment by moving the upper blade member from the upper position to the lower position by the elevating air cylinder 16 without elevating the robot arm 4, as illustrated in FIG. 7A and FIG. 7B.

Next, another variation of the above-mentioned substrate conveyance robot 1 will be described referring to FIG. 8 to FIG. 10B.

Figure 8:
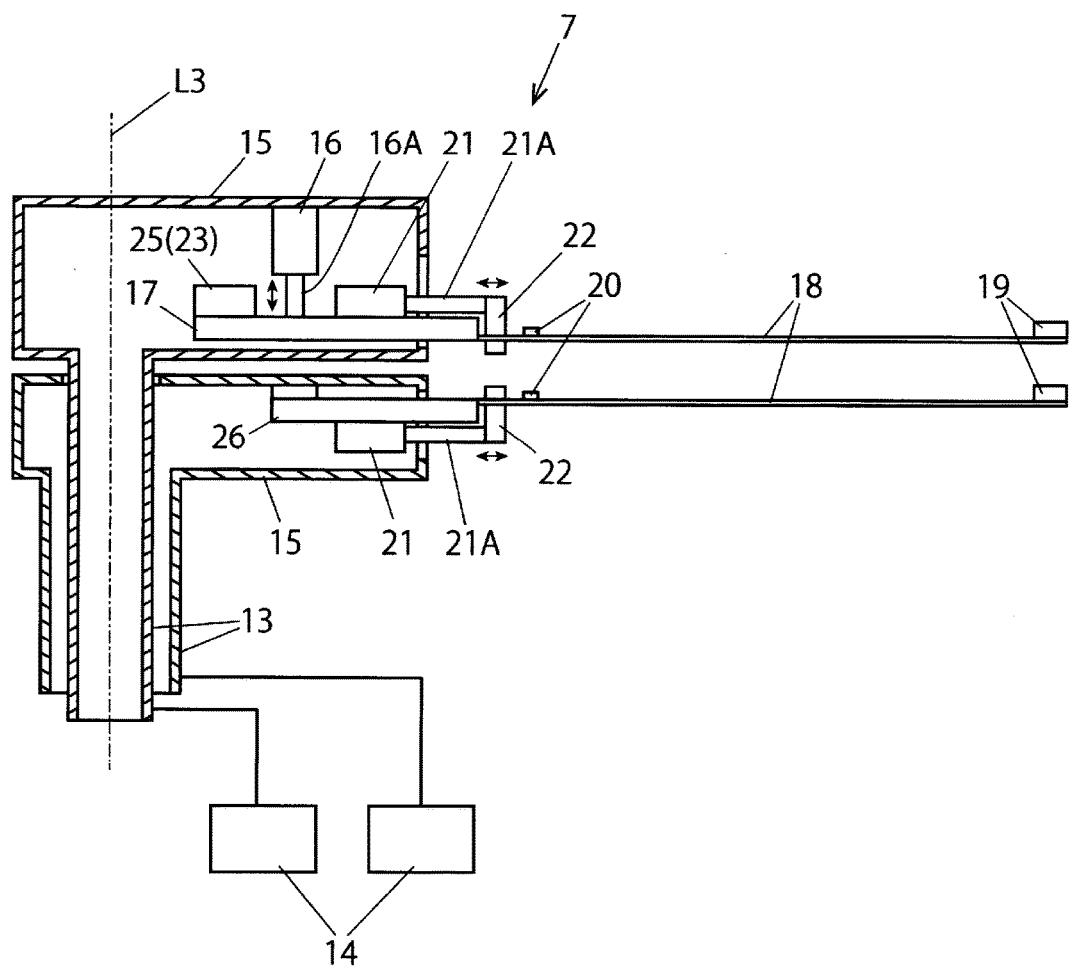
FIG. 8 is a schematic sectional view illustrating an internal structure of an upper hand and a lower hand of another variation of the substrate conveyance robot in FIG. 1.

In this example, as illustrated in FIG. 8, the additional hand (lower hand) 7 is provided in addition to the hand 7 of the above-mentioned embodiment (FIG. 2). In the lower hand 7, the blade member 18 is fixedly provided to the hand base portion 15 via the fixing member 26. The substrate detection unit is not provided to the lower hand 7.

The wrist shaft 13 of the upper hand 7 and the wrist shaft 13 of the lower hand 7 are concentrically arranged, and they can be rotated about the third rotational axis L3 independently from each other by the separate wrist shaft drive sources 14.

Figure 9A:
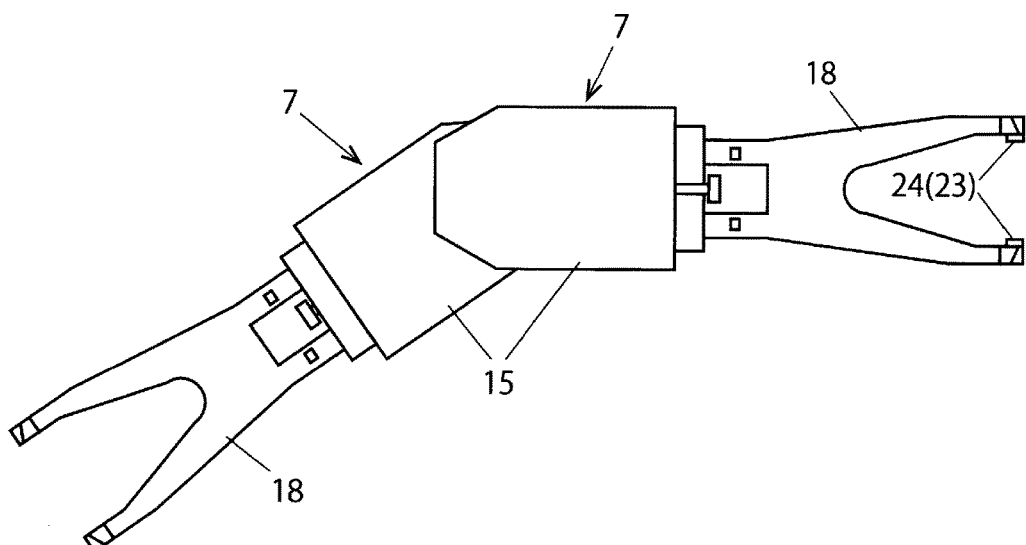
FIG. 9A schematically illustrates a state that the upper hand faces an advance direction in the variation of the substrate conveyance robot in FIG. 8.
Figure 9B:
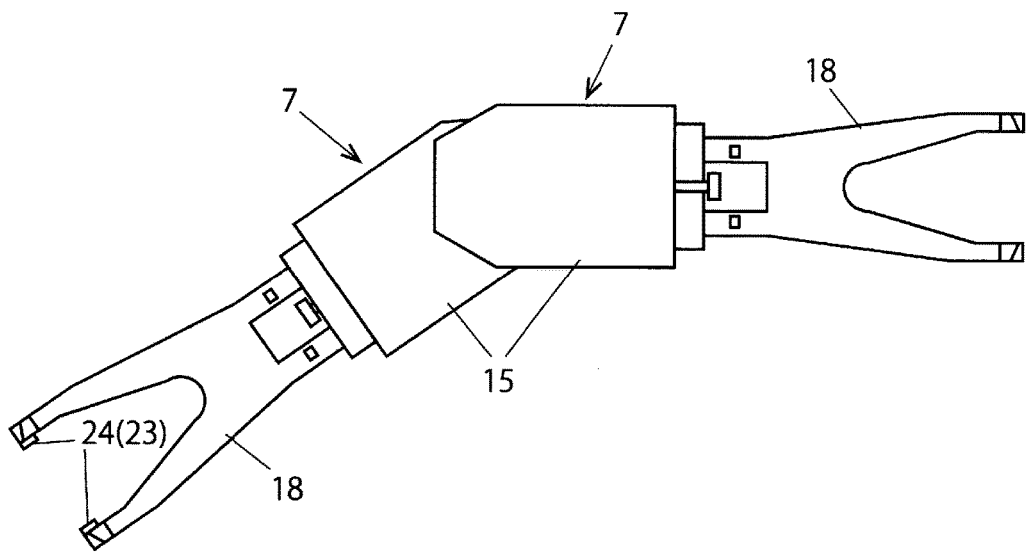
FIG. 9B schematically illustrates a state that the lower hand faces the advance direction in the variation of the substrate conveyance robot in FIG. 8.

In this example, as illustrated in FIG. 9A and FIG. 9B, the state that the upper hand 7 faces the approach direction for the substrate storing container and processing device and the state that the lower hand 7 faces the approach direction for the substrate storing container and processing device can be switched.

Figure 10A:
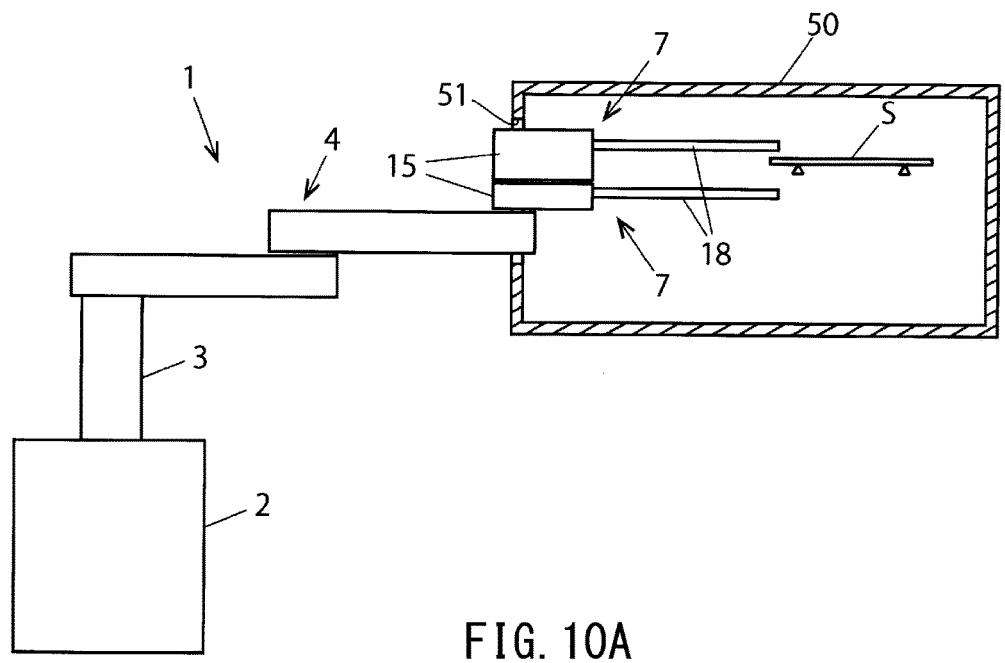
FIG. 10A is a view illustrating a substrate detection operation for detecting a substrate in a processing device by the substrate conveyance robot provided with the upper hand and the lower hand in FIG. 8.
Figure 10B:
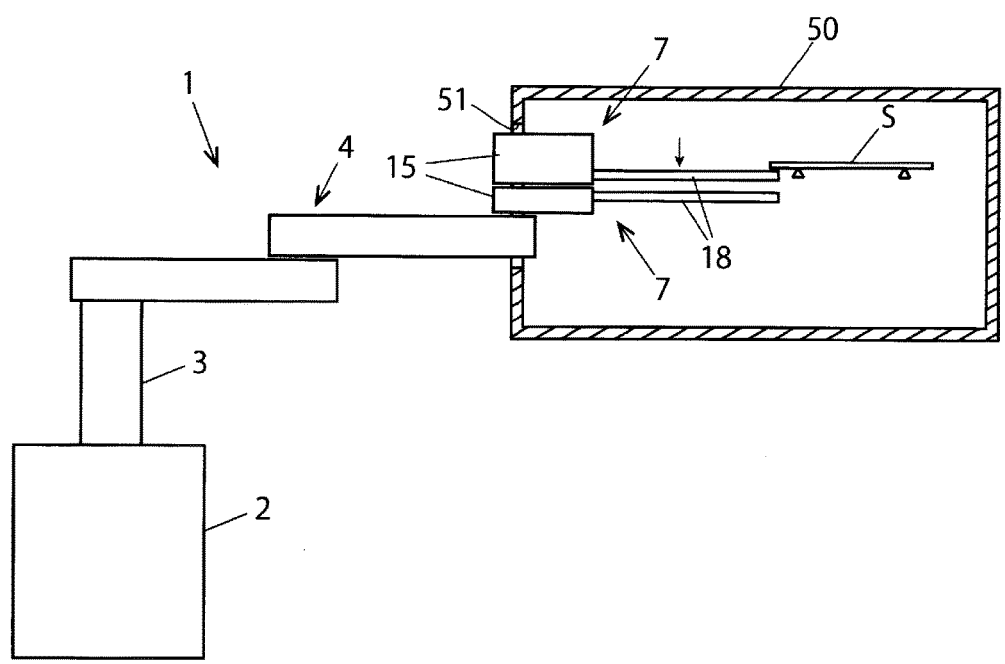
FIG. 10B is another view illustrating the substrate detection operation for detecting a substrate in the processing device by the substrate conveyance robot provided with the upper hand and the lower hand in FIG. 8.
Figure 11:
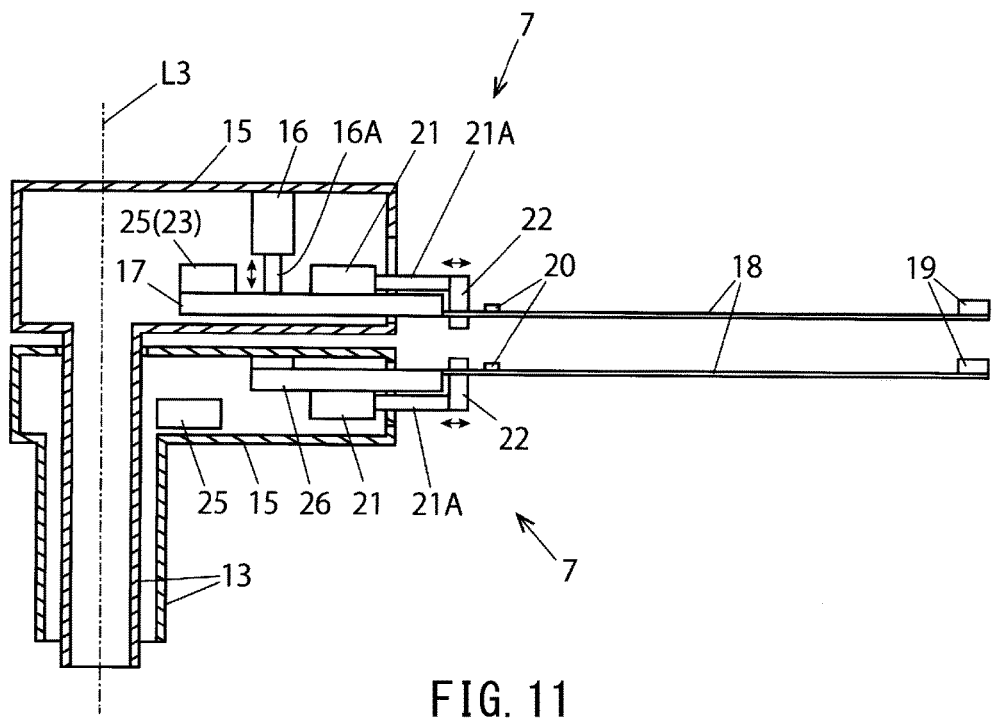
FIG. 11 is a schematic sectional view illustrating an internal structure of the upper hand and the lower hand of another variation of the substrate conveyance robot in FIG. 1.
Figure 12:
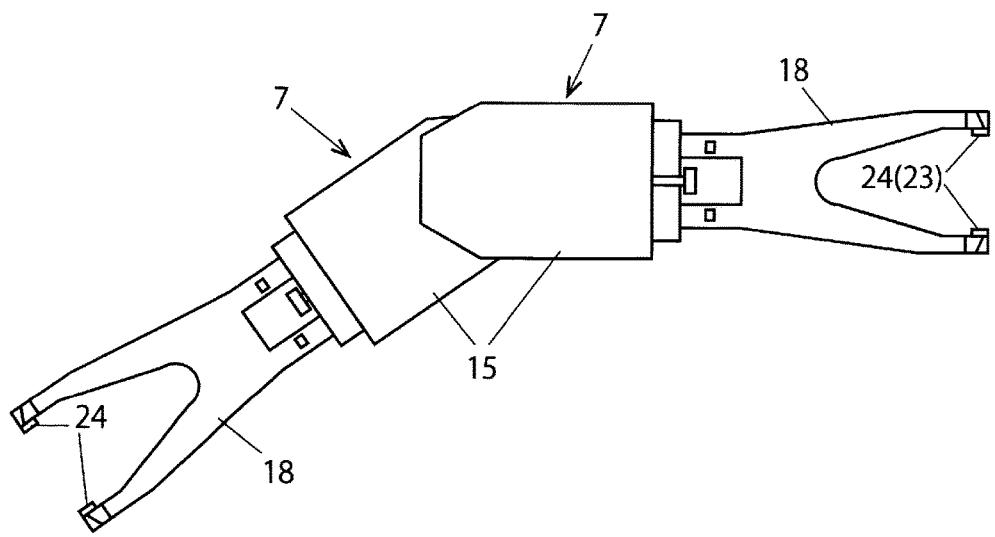
FIG. 12 schematically illustrates a state that the upper hand faces an advance direction in the variation of the substrate conveyance robot in FIG. 11.

Also in this example, the substrate S in the processing device 50 can be detected without hindrance while preventing collision of the robot 1 and the processing device 50 like the above-mentioned embodiment by moving the blade member 18 of the upper hand 7 from the upper position to the lower position by the elevating air cylinder 16 without elevating the robot arm 4, as illustrated in FIG. 10A and FIG. 10B.

Next, another variation of the above-mentioned substrate conveyance robot 1 will be described referring to FIG. 11 to FIG. 13B.

Figure 13A:
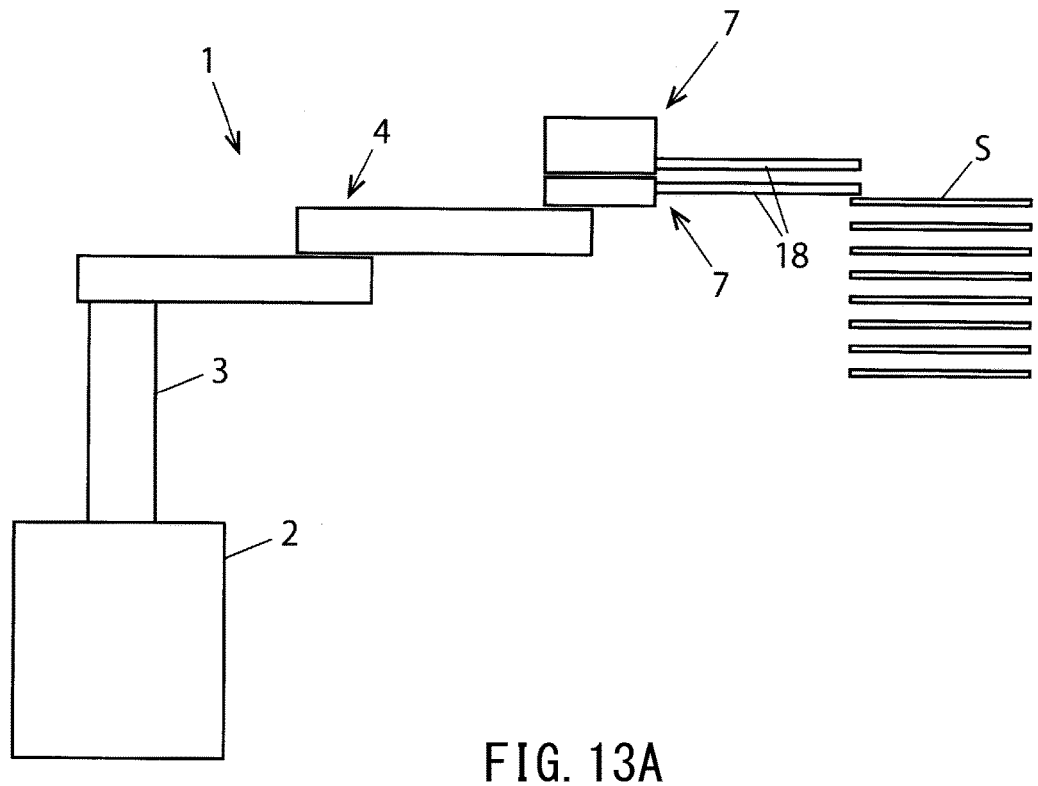
FIG. 13A is a view illustrating a mapping operation for detecting multiple substrates by the substrate conveyance robot provided with the upper hand and the lower hand in FIG. 11.
Figure 13B:
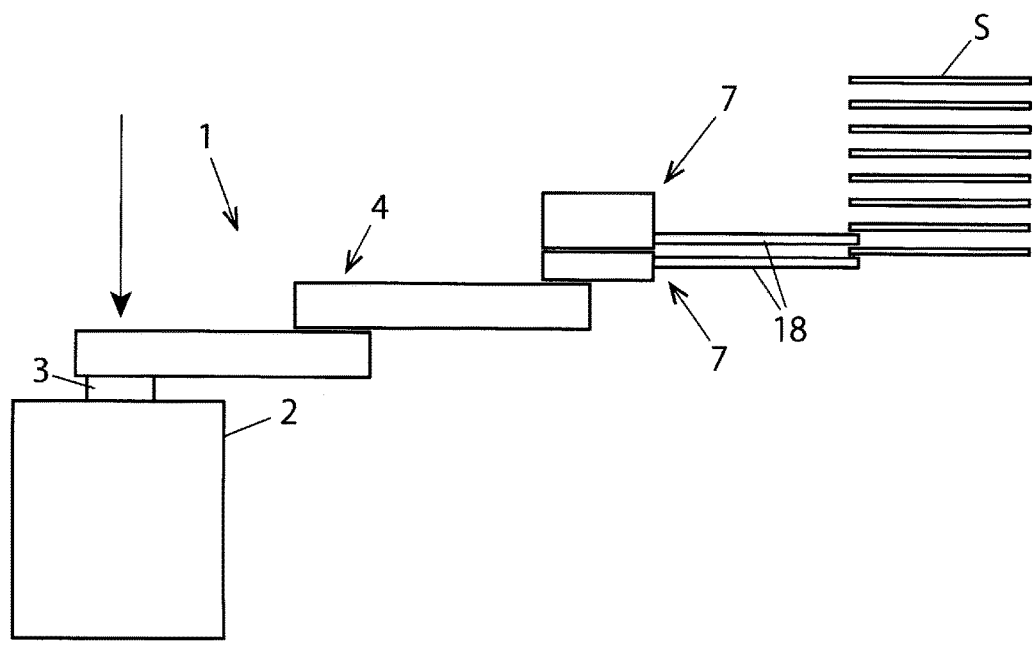
FIG. 13B is another view illustrating the mapping operation for detecting multiple substrates by the substrate conveyance robot provided with the upper hand and the lower hand in FIG. 11.

In this example, the substrate sensor 24 (FIG. 12) and the sensor amplifier 25 (FIG. 11) are provided also to the lower hand 7. The substrate sensor 24 and the sensor amplifier 25 provided to the lower hand 7 can be used for mapping of multiple substrates S stored in the substrate storing container as illustrated in FIG. 13A and FIG. 13B, for example.

In this mapping operation, the substrate sensor 24 provided to the distal end of the blade member 18 of the lower hand 7 is made to scan along edge portions of the multiple substrates S in the vertical direction by lowering or elevating the rotary spindle 3 so as to lower or elevate the robot arm 4.

Figure 14:
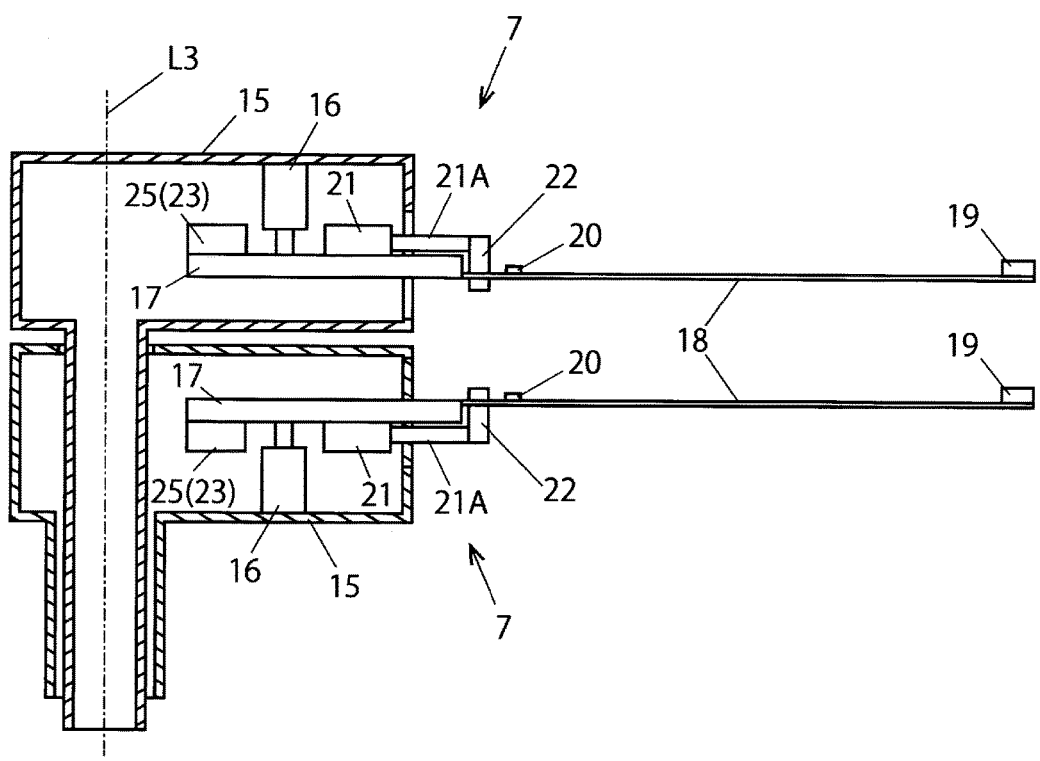
FIG. 14 is a schematic sectional view illustrating an internal structure of the upper hand and the lower hand of another variation of the substrate conveyance robot in FIG. 1.

Next, another variation of the above-mentioned substrate conveyance robot 1 will be described referring to FIG. 14.

In this example, the blade member 18 of the lower hand 7 is also provided to the hand base portion 15 so as to be elevated. Thereby, the above-mentioned substrate detection operation in the processing device 50 can be performed by either the upper hand 7 or the lower hand 7.

Note that, in the above-mentioned embodiment and each variation, the direction that the blade member 18 is made to scan in the detection step may be the lowering direction or the elevating direction.

Additionally, in the above-mentioned embodiment and each variation, mapping operation of the multiple substrates S can be performed using the substrate sensor 24 provided to the blade member 18 which can be elevated relative to the hand base portion 15. Thus, by lowering or elevating the rotary spindle 3 in a state that the blade member 18 which can be elevated relative to the hand base portion 15 is fixed to the hand base portion 15, mapping operation of the multiple substrates S can be performed using the substrate sensor 24 of the blade member 18.

DESCRIPTION OF REFERENCE NUMERALS

1 . . . substrate conveyance robot
2 . . . base
3 . . . rotary spindle
4 . . . robot arm
5 . . . first link member
6 . . . second link member
7 . . . hand (substrate holding device)
8 . . . Z-axis elevating drive source
9 . . . turning drive source
10 . . . drive source for rotational operation of second link member
11 . . . drive source for rotational operation of substrate holding device
12 . . . robot controller
13 . . . wrist shaft
14 . . . wrist shaft drive source
15 . . . hand base portion (wrist portion)
16 . . . elevating air cylinder
16A . . . piston of elevating air cylinder
17 . . . elevating member
18 . . . blade member
19 . . . fixed clamping portion
20 . . . bottom surface supporting portion
21 . . . pressing air cylinder
21A . . . piston of pressing air cylinder
22 . . . movable clamping portion
23 . . . substrate detection unit
24 . . . substrate sensor
25 . . . sensor amplifier
26 . . . fixing member
L1 . . . first rotational axis
L2 . . . second rotational axis
L3 . . . third rotational axis
S . . . substrate (wafer)

The invention claimed is:

1. A substrate conveyance robot for holding and conveying a substrate, comprising:
    a robot arm capable of being elevated;
    a substrate holding device mounted to the robot arm; and
    a substrate detection unit for detecting the substrate held by the substrate holding device,
    wherein the substrate detection unit has a substrate sensor for detecting the substrate, and a sensor elevating unit for scanning a region including a position where the substrate is arranged by elevating the substrate sensor without elevating the robot arm,
    wherein the substrate sensor is provided to the substrate holding device.

2. The substrate conveyance robot according to claim 1, wherein the substrate holding device has a wrist portion mounted to the robot arm and a blade member which is provided to the wrist portion and on which the substrate is to be placed,
    wherein the substrate sensor is provided to the blade member, and
    wherein the sensor elevating unit is configured to elevate the blade member relative to the wrist portion.

3. The substrate conveyance robot according to claim 1, wherein the substrate holding device has a wrist portion mounted to the robot arm, and an upper blade member and a lower blade member which are provided to the wrist portion and on which substrates are to be placed respectively,
    wherein the substrate sensor is provided to at least one blade member of the upper blade member and the lower blade member, and
    wherein the sensor elevating unit is configured to elevate the at least one blade member relative to the wrist portion.

4. The substrate conveyance robot according to claim 1, wherein the substrate holding device has an upper substrate holding device and a lower substrate holding device which can be driven independently from each other, and
    wherein the substrate detection unit is provided to at least one of the upper substrate holding device and the lower substrate holding device.

5. A substrate detection method for detecting a substrate held by a substrate conveyance robot, comprising:
    a preparation step of driving a robot arm of the substrate conveyance robot so as to bring a substrate holding device mounted to the robot arm close to a position where the substrate is arranged; and
    a detection step of detecting the substrate by elevating a substrate sensor provided to the substrate holding device without elevating the robot arm so as to scan a region including a position where the substrate is arranged.

6. The substrate detection method according to claim 5, wherein the substrate holding device has a wrist portion mounted to the robot arm, and a blade member which is provided to the wrist portion and on which the substrate is to be placed,
    wherein the substrate sensor is provided to the blade member, and wherein the blade member is elevated relative to the wrist portion in the detection step.

7. The substrate detection method according to claim 5, wherein the substrate holding device has a wrist portion mounted to the robot arm, and an upper blade member and a lower blade member which are provided to the wrist portion and on which substrates are to be placed respectively,
    wherein the substrate sensor is provided to at least one blade member of the upper blade member and the lower blade member, and
    wherein the at least one blade member is elevated relative to the wrist portion in the detection step.

8. The substrate detection method according to claim 5, wherein the substrate holding device has an upper substrate holding device and a lower substrate holding device which can be driven independently from each other,
    wherein the substrate detection unit is provided to at least one substrate holding device of the upper substrate holding device and the lower substrate holding device, and
    wherein the substrate sensor provided to the at least one substrate holding device is elevated in the detection step.

* * * * *